United States Patent [19]

Suzuki et al.

[11] 4,091,296
[45] May 23, 1978

[54] SEMICONDUCTOR R-S FLIP-FLOP CIRCUIT

[75] Inventors: Yasoji Suzuki, Ayase; Yukuya Tokumaru; Masanori Nakai, both of Yokohama, all of Japan

[73] Assignee: Tokyo Shibaura Electric Co., Ltd., Tokyo, Japan

[21] Appl. No.: 746,169

[22] Filed: Nov. 30, 1976

[30] Foreign Application Priority Data

Dec. 1, 1975 Japan .................... 50-142179

[51] Int. Cl.² ........................... H03K 3/286
[52] U.S. Cl. .................... 307/292; 307/279; 307/299 B; 307/303; 357/15; 357/44; 357/46
[58] Field of Search ............ 307/247 R, 291, 292, 307/213, 303, 317 A, 299 B, 279; 357/15, 44, 46

[56] References Cited

U.S. PATENT DOCUMENTS

| | | | |
|---|---|---|---|
| 3,553,485 | 1/1971 | Hassett | 307/292 X |
| 3,849,675 | 11/1974 | Waaben | 307/292 |
| 3,993,918 | 11/1976 | Sinclair | 307/291 X |

Primary Examiner—John Zazworsky
Attorney, Agent, or Firm—Finnegan, Henderson, Farabow & Garrett

[57] ABSTRACT

A semiconductor R-S flip-flop circuit comprises first and second input terminals, first and second output terminals, a first integrated injection logic unit consisting of a first transistor acting as a switching element and a second transistor acting as an injector, and a second integrated injection logic unit consisting of a third transistor acting as a switching element and a fourth transistor acting as an injector. The R-S flip-flop circuit further includes a first diode having a cathode connected to the first input terminal and an anode connected to the base of the first transistor, a second diode having a cathode connected to the second input terminal and an anode connected to the base of the third transistor, a third diode having an anode connected to the base of the first transistor and a cathode connected to the collector of the third transistor, and a fourth diode having an anode connected to the base of the third transistor and a cathode connected to the collector of the first transistor.

2 Claims, 8 Drawing Figures

SEMICONDUCTOR R-S FLIP-FLOP CIRCUIT

This invention relates to a semiconductor R-S flip-flop circuit comprising an IIL (Integrated Injection Logic) unit.

An IIL unit comprises two transistors formed in the same semiconductor substrate, that is, a transistor (hereinafter referred to as "a switching transistor") operating as a switching element and a transistor (hereinafter referred to as "a injector transistor") operating as an injector for injecting minority carriers into the base region of the switching transistor, and acts as inverter.

The two transistors have two common semiconductor areas.

In FIG. 1 there is shown a conventional semiconductor R-S flip-flop circuit comprising IIL units. A flip-flop circuit in FIG. 1 is constituted of a semiconductor device as shown in FIG. 2. That is, the flip-flop circuit comprises an IIL unit consisting of a lateral injector transistor $Q_2$ which is constituted of a $P^+$ layer 1, P layer 2, $N^{-0}$ layer 3, P layer 4 and $P^+$ layer 5 and acts as an injector and a vertical switching transistor $Q^1$ which is constituted of an $N^+$ layer 6, $N^-$ layer 3, P layer 4, $N^+$ layer 7 and $N^+$ layer 8 and acts as a switching element, and an IIL unit consisting of a lateral injector transistor $Q_4$ which is constituted of a $P^+$ layer 9, P layer 10, $N^-$ layer 3, P layer 11 and $P^+$ layer 12 and acts as injector and a vertical switching transistor $Q_3$ which is constituted of an $N^+$ layer 6, $N^-$ layer 3, P layer 11, $N^+$ layer 13 and $N^+$ layer 14 and acts as a switching element.

In a "1" level input signal is supplied to input terminals S and R of the conventional semiconductor R-S flip-flop circuit, the base potentials of the transistors $Q_1$ and $Q_3$ do not become base-emitter potential $V_{BE}$ and the base potential of one transistor, for example, the transistor $Q_3$, becomes a collector-emitter potential $V_{CE}$, i.e., a zero potential under the influence of the other transistor, for example, the transistor $Q_1$ which has been turned ON. That is, the "1" level input signal to the input terminal R of the R-S flip-flop circuit forcedly becomes a zero level. Now suppose that the transistor $Q_1$ is turned ON. In this case, current flows through transistor $Q_4$ and $Q_1$. As a result, a voltage $V_{BE}$ on the base of the transistor $Q_3$ becomes a collector-emitter voltage $V_{CE}$ of the transistor $Q_1$ i.e., substantially a zero voltage. Since the input terminal R is connected directly to the base of the transistor $Q_3$, a voltage on the input terminal R becomes substantially zero irrespective of a "1" level signal being supplied to the input terminal R. This means that if the input signal to the input terminal R of the R-S flip-flop circuit is used to drive an additional logic circuit 21 a "0" level signal is supplied, instead of an original "1" level signal, to the logic circuit 21, leading to an erroneous operation of the logic circuit 21 (FIG. 3). Furthermore, the dissipation power is disadvantageously increased to force the "1" level input signal to a zero level.

FIG. 4 shows another semiconductor R-S flip-flop circuit. This arrangement can avoid the disadvantages of the flip-flop circuit as shown in FIGS. 1 and 3. However, the R-S flip-flop circuit uses four switching transistors $Q_1$, $Q_3$, $Q_5$ and $Q_7$, preventing high integration of a semiconductor logic circuit. A transistor $Q_6$, together with the transistor $Q_5$, constitutes an IIL unit and a transistor $Q_8$, together with the transistor $Q_7$, constitutes another IIL unit.

It is accordingly the object of this invention to provide a semiconductor R-S flip-flop circuit suited for high integration, in which even when a "1" level input signal is supplied to both the input terminals neither signal is forced to at a zero level.

According to this invention there is provided a semiconductor R-S flip-flop circuit comprising first and second input terminals, a first IIL unit consisting of a first transistor acting as a switching element and a second transistor acting as an injector, a second IIL unit consisting of a third transistor acting as a switching element and a fourth transistor acting as an injector, a first diode having a cathode connected to the first input terminal and an anode connected to the base of the first transistor, a second diode having a cathode connected to the second input terminal and an anode connected to the base of the third transistor, a third diode having a cathode connected to the collector of the third transistor and an anode connected to the base of the first transistor, and a fourth diode having a cathode connected to the collector of the first transistor and an anode connected to the base of the third transistor.

In the above-mentioned semiconductor R-S flip-flop circuit a signal level at the output side is not influenced by a signal level at the input side due to the presence of four Schottky diodes each of which is formed between an electrode and a semiconductor. In consequence, even if a "1" level signal is inputted to both the input terminals there is no chance that either one of the signals will be forced to at a zero level. Although the four Schottky diodes are additionally used, the R-S flip-flop circuit of this invention permits a high circuit integration without involving an increase in the number of IIL units.

This invention will be further described by way of example by reference to the accompanying drawings in which.

Figure 5:
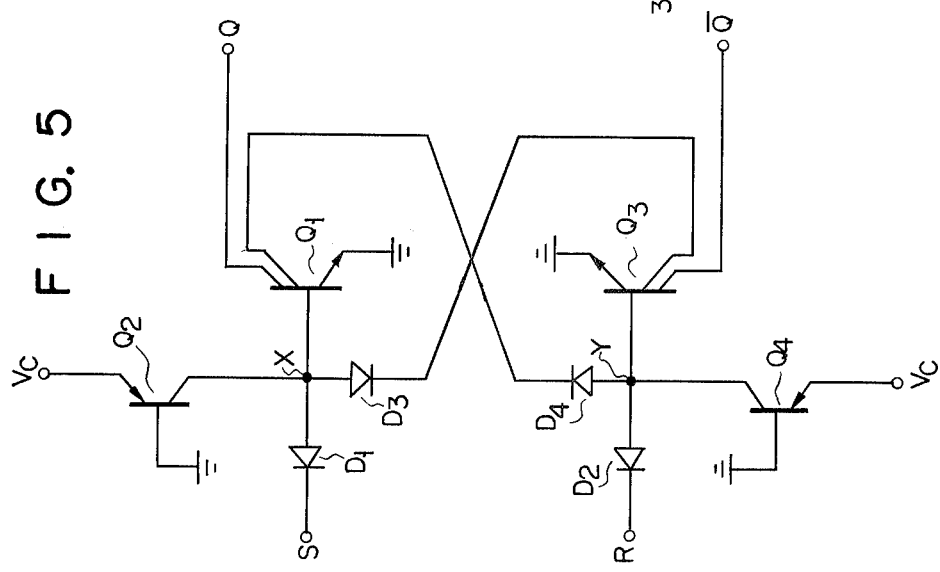
FIG. 5 shows a semiconductor R-S flip-flop circuit according to one embodiment of this invention.

In FIG. 5 a semiconductor R-S flip-flop circuit according to one embodiment of this invention comprises input terminals R and S, a first IIL unit consisting of a switching transistor $Q_1$ and an injector transistor $Q_2$, a second IIL unit consisting of a switching transistor $Q_3$ and an injector transistor $Q_4$, a first diode $D_1$ having a cathode connected to the input terminal S and an anode connected to the base of the switching transistor $Q_1$, a second diode having a cathode connected to the input terminal R and an anode connected to the base of the switching transistor $Q_3$, a third diode $D_3$ having a cathode connected to a first collector of the switching transistor $Q_3$ and an anode connected to the base of the switching transistor $Q_1$, a fourth diode $D_4$ having a cathode connected to a first collector of the switching transistor $Q_1$ and an anode connected to the base of the switching transistor $Q_3$, and output terminals $\overline{Q}$ and $Q$ connected to second collectors of the transistors $Q_3$ and $Q_1$, respectively. The flip-flop circuit shown in FIG. 5 is constituted of a semiconductor device as shown in FIG. 6.

Figure 6:
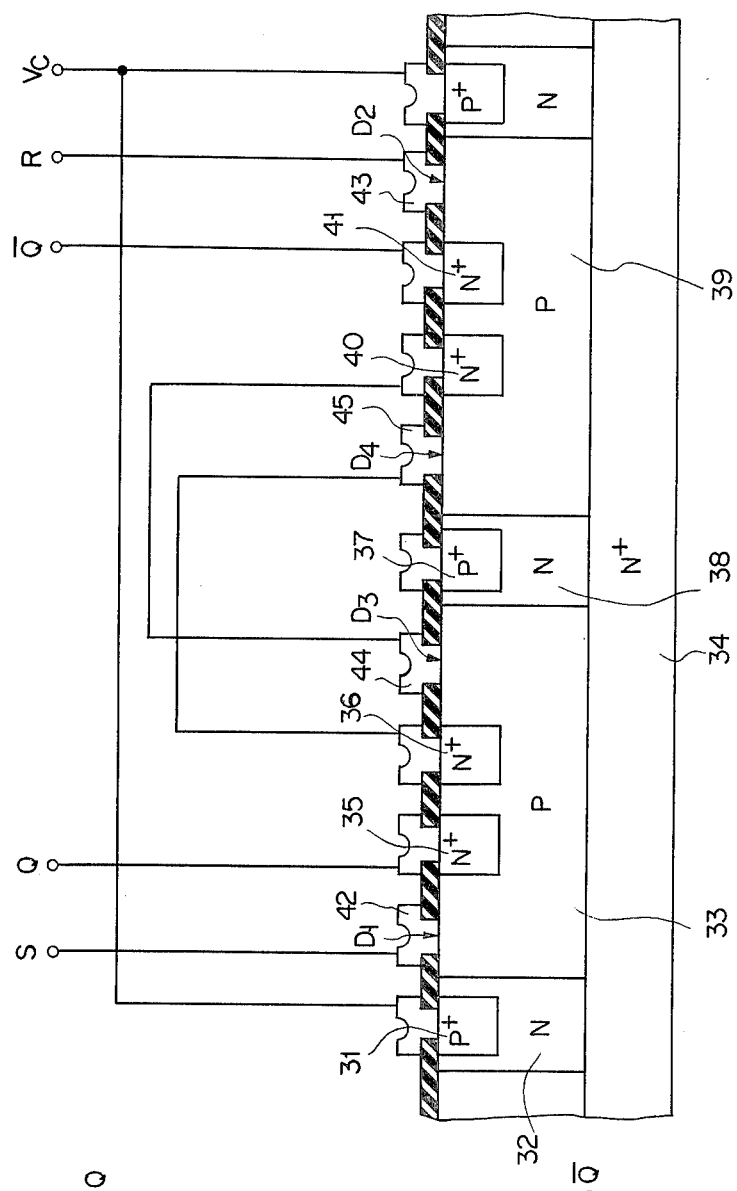
FIG. 6 is a semiconductor device which corresponds to the circuit in FIG. 5.

As will be evident from FIG. 6 the transistor $Q_2$ is comprised of a P+ layer 31, N layer 32 and P layer 33; the transistor $Q_1$ an N+ layer 34, P layer 33, N+ layer 35 and N+ layer 36; the transistor $Q_4$ a P+ layer 37, N layer 38 and P layer 39; and the transistor $Q_3$ the N+ layer 34, P layer 39, N+ layer 40 and N+ layer 41. The diode $D_1$ is Schottky diode formed at a contact surface between the P layer 33 and an electrode 42 connected to the input terminal S; the diode $D_2$ a Schottky diode formed at a contact surface between the P layer 39 and an electrode 43 connected to the input terminal R; the diode $D_3$ a Schottky diode formed at a contact surface between the P layer 33 and an electrode 44; and the diode $D_4$ a Schottky diode connected at a contact surface between the P layer 39 and an electrode 45.

The logical operation of the flip-flop circuit will be explained below by referring to FIG. 7.

Figure 7:
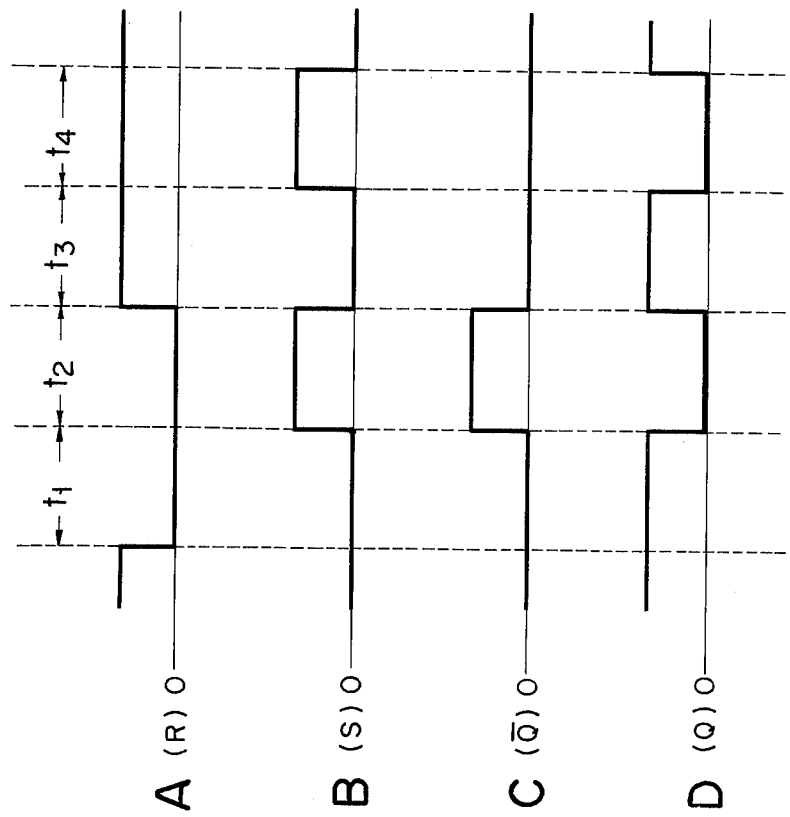
FIG. 7 is a timing chart for explaining the action of the flip-flop circuit in FIG. 5.

Referring to FIG. 7, A shows the waveform of a signal inputted to the input terminal R; the waveform of a signal inputted to the input terminal S; the waveform of a signal appearing from the output terminal $\overline{Q}$; the waveform of a signal appearing from the output terminal Q.

(1) Where a "0" level signal is inputted to the input terminals R and S (time $t_1$ in FIG. 7), the flip-flop circuit maintains its original state.

(2) Where a "0" level signal is inputted to the input terminal R and a "1" level signal the input terminal S (time $t_2$ in FIG. 7), the diode $D_2$ is rendered conductive to cause a potential on a junction Y to become a zero level to permit the transistor $Q_3$ to be rendered nonconductive. In consequence, a potential on the output terminal $\overline{Q}$ becomes a "1" level.

On the other hand, the diode $D_1$ is rendered nonconductive to cause a potential in a junction X to become a "1" level to permit the transistor $Q_1$ to be rendered conductive. As a result, a potential on the output terminal Q becomes a "0" level.

(3) Where a "1" level signal is inputted to the input terminal R and a "0" level signal the input terminal S (time $t_3$ in FIG. 7), output signals having levels reversed to those mentioned in paragraph 2 are generated. That is, a "0" level signal appears from the output terminal $\overline{Q}$ and a "1" level signal appears from the output terminal Q.

(4) Where a "1" level signal is inputted to the input terminals R and S (time $t_4$ in FIG. 7), signal levels on the output terminals Q and $\overline{Q}$ are not determined. Usually, such a state is treated as a combination to be forbidden.

The above-mentioned logical operation can be expressed on the following truth table.

| R | S | Q | $\overline{Q}$ |
|---|---|---|---|
| 0 | 0 | original state | original state |
| 0 | 1 | 1 | 0 |
| 1 | 0 | 0 | 1 |
| 1 | 1 | forbidden state | forbidden state |

According to the flip-flop circuit of this invention, even when a "1" level signal is inputted to the input terminals R and S, an independent operating relation exists between the input side and the output side due to the diodes $D_1$ to $D_4$ and in consequence there is no chance that either one of input signals will be forced to a zero level. The reason for this is as follows: Suppose that in the FIG. 5 circuit a "1" level signal is supplied to the input terminals R and S. In this case, which of the transistors $Q_1$ and $Q_3$ is turned ON is uncertain. Let it be assumed that the transistor $Q_1$ is turned ON. That is, current flows through transistor $Q_4$, diode $D_4$ and transistor $Q_1$. Then, a voltage $V_{BE}$ on the base of the transistor $Q_3$, i.e. the point Y, becomes a collector-emitter voltage $V_{CE}$ of the transistor $Q_1$, i.e., substantially a zero potential. At this time, the diode $D_2$ connected between the input terminal R and the transistor $Q_3$ becomes reverse-biased into nonconduction. For this reason, the voltage on the input terminal R is not forced to be equal to a base voltage $V_{BE}$ of the transistor $Q_3$ (i.e., become zero voltage) and it is maintained at a voltage level of a "1" level input signal. That is, the voltage on the input terminal R, even if the transistor $Q_1$ is turned ON, is maintained at a voltage level of the "1" level input signal.

Suppose now that the transistor $Q_3$ is turned ON. This case is the same as when the transistor $Q_1$ is rendered conductive. Stated in detail, current flows through the transistor $Q_2$, diode $D_3$ and transistor $Q_3$. A voltage on the base of the transistor $Q_1$, i.e. on the point X, becomes a collector emitter voltage of the transistor $V_{BE}$, i.e., substantially zero voltage. At this time, a diode $D_1$ connected between the input terminal S and the transistor $Q_1$ becomes reverse-biased into nonconduction. For this reason, the voltage on the input terminal S is not forced to a potential equal to a base voltage of the transistor $Q_1$ (i.e. does not become substantially zero voltage). That is, the voltage on the input terminals, even if the transistor $Q_3$ is turned ON, is maintained at a level of a "1" level input signal.

As will be apparent from the above-mentioned operation, a "1" level signal is supplied to the input terminals R and S and no matter which of the transistors $Q_1$ and $Q_3$ is turned ON, the voltages on the input terminals R and S are maintained under the action of Schottky diodes $D_1$ to $D_4$ at the level of a "1"0 level input signal without being forced to the voltage level equal of the collector-emitter voltage $V_{CE}$ of the turned ON transistor (i.e. become substantially a zero voltage).

Figure 2:
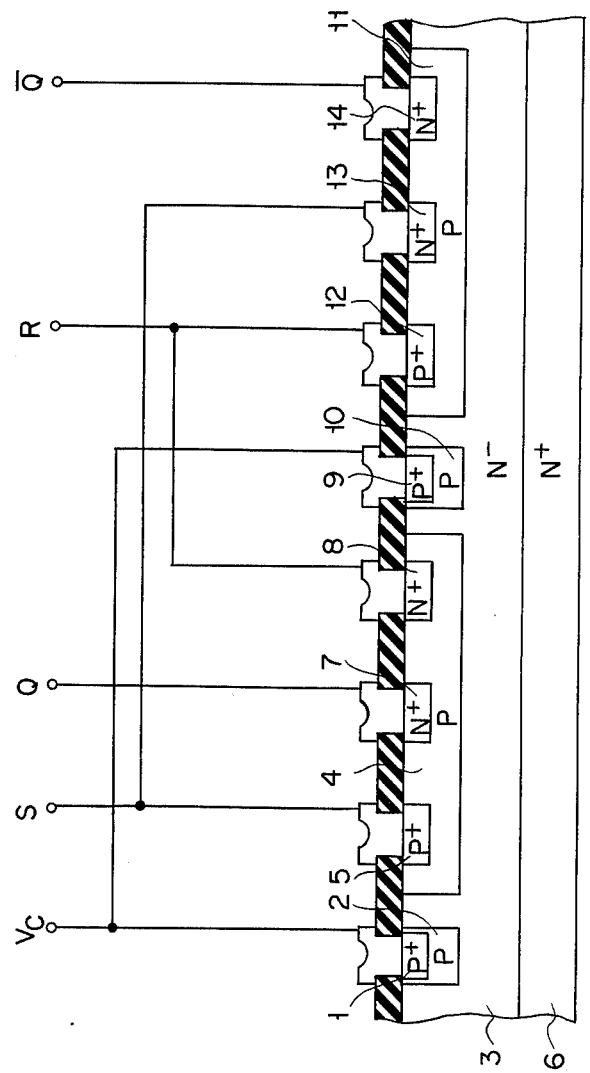
FIG. 2 shows the semiconductor device which corresponds to the circuit in FIG. 1.
Figure 1:
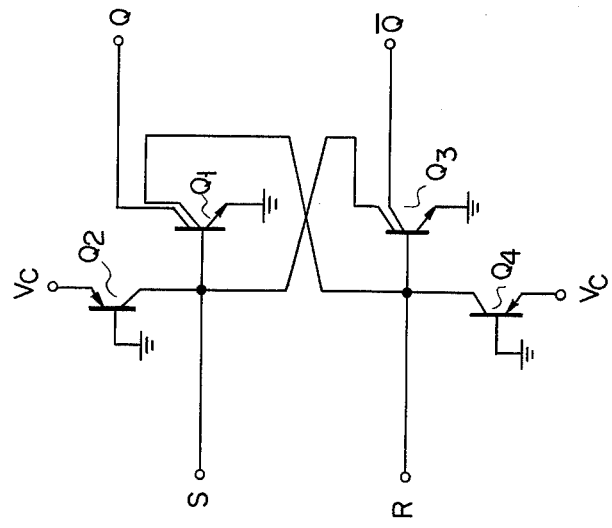
FIG. 1 shows a conventional semiconductor R-S flip-flop circuit.
Figure 4:
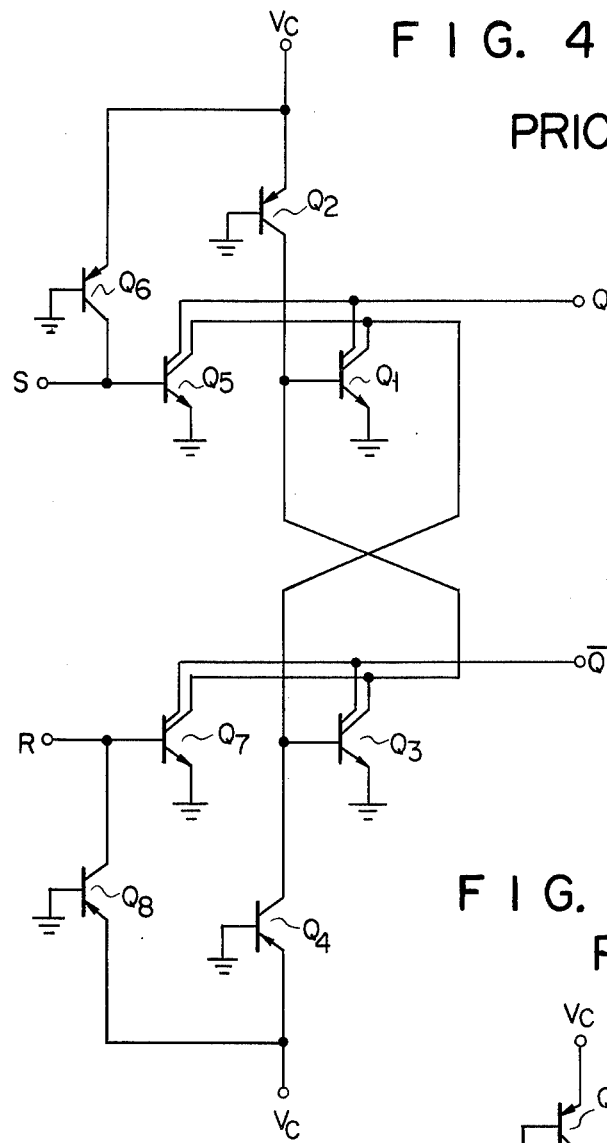
FIG. 4 shows another conventional semiconductor R-S flip-flop circuit.
Figure 3:
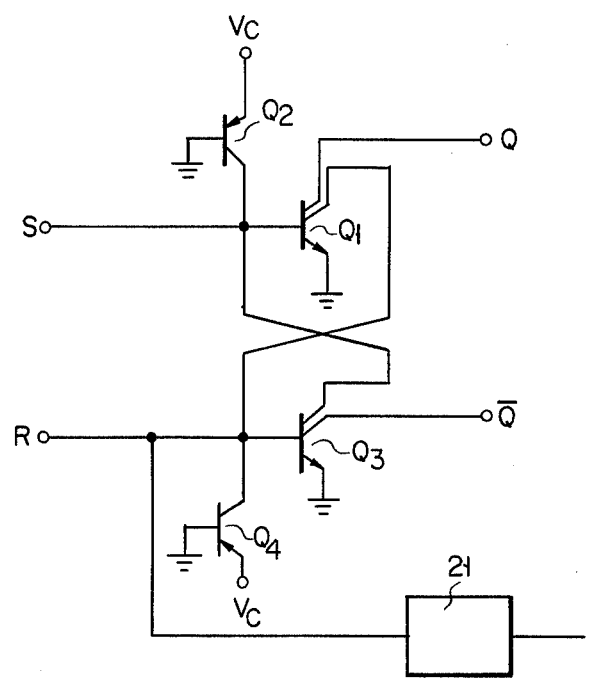
FIG. 3 shows a circuit as obtained by connecting an additional logic circuit to the flip-flop circuit in FIG. 1.

Therefore, even if an additional logic circuit 21 is connected as shown in FIG. 3 to the input terminal R, a "1" level input signal is supplied to the logic circuit 21 without being caused to become a zero potential, thus preventing an erroneous operation of the logic circuit 21. The same result obtains if the additional logic circuit 21 is connected to the input terminal S.

With the flip-flop circuit of this invention, only four diodes are added to the conventional flip-flop circuit and there is involved no increase in the number of IIL units.

Since each IIL unit is constructed of one injector transistor and one switching transistor, if the requisite number of IIL units are increased, the packing density of the semiconductor device will be lowered. Each of the diodes $D_1$ to $D_4$ is a Schottky diode which is formed at a contact surface between an electrode and a P layer constituting the base region of a vertical transistor. The presence of these diodes provides no bar to a high integration of the semiconductor device. That is, this invention provides a semiconductor R-S flip-flop circuit which is simple in construction and thus permits a high integration and in which, even if a "1" level signal is inputted to both the input terminals, there is no chance that either one of input signals will be made forcedly at a zero level.

Another embodiment of this invention will be explained by referring to FIG. 8.

Figure 8:
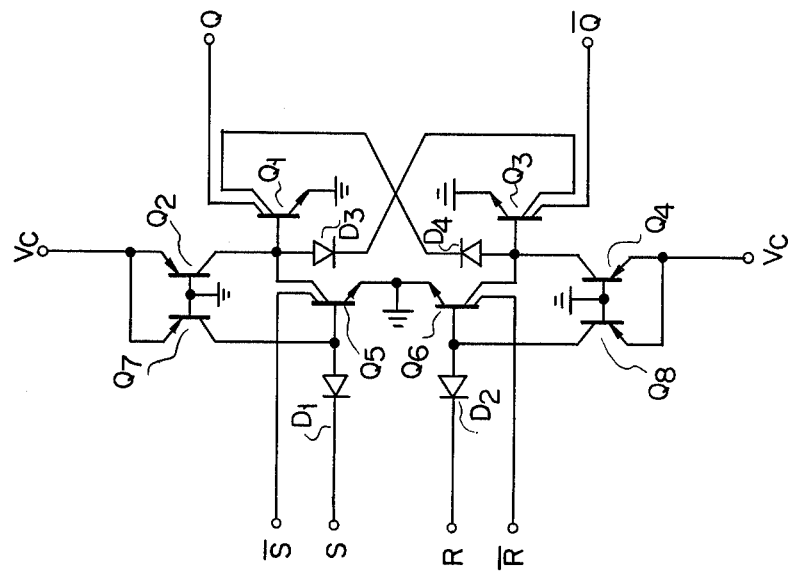
FIG. 8 shows a semiconductor R-S flip-flop circuit according to another embodiment of this invention.

In the embodiment shown in FIG. 8, switching transistors $Q_5$ and $Q_6$ and injector transistors $Q_7$ and $Q_8$ are added to the flip-flop circuit shown in FIG. 5. The switching transistor $Q_5$ has an emitter grounded, a first collector connected to the base of the transistor $Q_1$ and a base connected to the anode of the diode $D_1$, and the switching transistor $Q_6$ has an emitter grounded, a first collector connected to the base of transistor Q3 and a base connected to the anode of the diode $D_2$. The injector transistor $Q_7$ constitutes, together with the transistor $Q_5$, an IIL unit and acts as an inverter. The injector transistor $Q_8$ constitutes, together with the transistor $Q_6$, and IIL unit and acts as an inverter. The switching transistors $Q_5$ and $Q_6$ are of a multi-collector type. A second collector of the switching transistor $Q_5$ is connected to the terminal $\overline{S}$ and a second collector of the transistor $Q_6$ is connected to the terminal $\overline{R}$. This flip-flop circuit operates in substantially the same way as the above-mentioned flip-flop circuit and further explanation is therefore omitted. This embodiment can also avoid the disadvantage that, where a "0" level signal is inputted to the input terminals R and S, either one of signals is made forcedly at a zero level. In this embodiment it is possible to obtain at the terminals $\overline{S}$ and $\overline{R}$ signals phase-reversed with respect to input signals inputted to the input terminals S and R.

Although the switching transistors have been explained as having two collectors, multi-collector transistors having three or more collectors may be used.

What we claim is:

1. A semiconductor R-S flip-flop circuit comprising first and second input terminals; first and second output terminals; a first diode means having a cathode connected to the first input terminal and adapted to be rendered nonconductive when a "1" level signal is inputted to the first input terminal; a first switching transistor having a base connected to the anode of the first diode means and a first collector connected to the first output terminal; a first injector transistor constituting together with the first switching transistor an integrated injection logic unit; a second diode means having an anode connected to the base of the first switching transistor; a third diode means having a cathode connected to the second input terminal and adapted to be rendered nonconductive when a "1" level signal is inputted to the second input terminal; a fourth diode means having a cathode connected to a second collector of the first switching transistor; a second switching transistor having a base connected to the anode of the third and fourth diode means, a first collector connected to the second output terminal and a second collector connected to the cathode of the second diode means; and a second injector transistor constituting together with the second switching transistor an integrated injection logic circuit.

2. A semicondcutor R-S flip-flop circuit according to claim 1, further including a third output terminal on which a signal opposite in level to a signal on the first input terminal appears; a fourth output terminal on which a signal opposite in level to a signal on the second input terminal appears; a third switching transistor having a base connected to the anode of said first diode means, a first collector connected to the third output terminal and a second collector connected to the base of said first switching transistor; a third injector transistor constituting together with the third switching transistor an integrated injection logic unit; a fourth switching transistor having a base connected to the anode of said third diode means, a first collector connected to said fourth output terminal and a second collector connected to the base of said second switching transistor; and a fourth injector transistor constituting together with the fourth switching transistor an integrated injection logic unit.

* * * * *

UNITED STATES PATENT AND TRADEMARK OFFICE
CERTIFICATE OF CORRECTION

PATENT NO. : 4,091,296

DATED : May 23, 1978

INVENTOR(S) : Yasoji Suzuki et al.

It is certified that error appears in the above–identified patent and that said Letters Patent are hereby corrected as shown below:

In column 1, line 22, delete "$N^{-0}$" and insert therefor --$N^{-}$--.

In column 1, line 57, delete " $^{\sim}1^{\sim}$ " and insert therefore -- "1"--.

In column 2, line 5, delete "at".

In column 2, line 30, delete "at".

In column 3, line 25, before the words "the waveform" insert the words --B shows --.

In column 3, line 26, before the words "the waveform" insert the words --C shows--.

In column 3, lines 27-28, before the words "the waveform" insert the words --D shows--.

In column 4, line 28, delete the words "collector emitter" and insert therefore --collector-emitter--.

In column 4, line 43, delete ""1"0" and insert therefor --"1"--.

Signed and Sealed this

Tenth Day of April 1979

[SEAL]

Attest:

RUTH C. MASON
Attesting Officer

DONALD W. BANNER
Commissioner of Patents and Trademarks